United States Patent
Turlot et al.

(10) Patent No.: US 6,502,530 B1
(45) Date of Patent: Jan. 7, 2003

(54) DESIGN OF GAS INJECTION FOR THE ELECTRODE IN A CAPACITIVELY COUPLED RF PLASMA REACTOR

(75) Inventors: Emmanuel Turlot, Villebon sur Yvette (FR); Jean-Baptiste Chevrier, Sevelen (CH); Jacques Schmitt, La Ville du Bois (FR); Jean Barreiro, Palaiseau (FR)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/559,408

(22) Filed: Apr. 26, 2000

(51) Int. Cl.$^7$ ............................................. C23C 16/509
(52) U.S. Cl. .............................. 118/723 E; 156/345.43; 156/345.47; 118/723 R; 118/728
(58) Field of Search ............................... 118/723 E, 715, 118/728, 725, 719, 723 MP, 723 IR, 723 ME, 724; 156/395, 345; 219/121.11; 427/563, 568, 570, 575; 438/674, 680, 706

(56) References Cited

U.S. PATENT DOCUMENTS

| | | | |
|---|---|---|---|
| 4,792,378 A | * 12/1988 | Rose et al. .................. 438/706 |
| 5,453,124 A | * 9/1995 | Moslehi et al. .............. 118/715 |
| 5,593,540 A | * 1/1997 | Tomita et al. .................... 216/2 |
| 5,595,606 A | * 1/1997 | Fujikawa et al. ............. 118/725 |
| 5,616,373 A | * 4/1997 | Karner et al. ................ 427/122 |
| 5,622,606 A | * 4/1997 | Kugler et al. ............ 204/298.03 |
| 5,819,434 A |   10/1998 | Herchen et al. ......... 156/345.34 |
| 5,963,834 A | * 10/1999 | Hatano et al. ................ 438/685 |
| 5,964,947 A |   10/1999 | Zhao et al. ................. 118/723 E |
| 6,086,677 A | * 7/2000 | Umotoy et al. .............. 118/715 |
| 6,161,500 A | * 12/2000 | Kopacz et al. ............ 118/723 E |
| 6,245,192 B1 | * 6/2001 | Dhindsa et al. .............. 438/706 |
| 6,357,385 B1 | * 3/2002 | Ohmi et al. ......... 118/723 MW |
| 6,379,756 B2 | * 4/2002 | Komino ........................ 216/67 |
| 6,391,147 B2 | * 5/2002 | Imafuku et al. .......... 118/723 E |
| 6,399,484 B1 | * 6/2002 | Yamasaki et al. ............ 438/627 |

FOREIGN PATENT DOCUMENTS

| | | | |
|---|---|---|---|
| DE | 4412541 | 4/1997 | |
| JP | 357037821 A | * 3/1982 | ......... H01L/21/205 |
| JP | 401168023 A | * 7/1989 | ......... H01L/21/205 |
| JP | 402234419 A | * 9/1990 | ......... H01L/21/205 |
| JP | 7-22341 | * 1/1995 | ......... H01L/21/205 |
| JP | 9027398 | 1/1997 | |
| JP | 11054296 | 2/1999 | |
| JP | 11181572 | 7/1999 | |
| JP | 2000-290777 | * 10/2000 | ............ C23C/16/44 |
| WO | 01/11658 | 2/2001 | |

* cited by examiner

Primary Examiner—Gregory Mills
Assistant Examiner—Rudy Zervigon
(74) Attorney, Agent, or Firm—Crowell & Moring LLP

(57) ABSTRACT

A plasma reactor has a reactor vessel and a pair of electrodes in the form of spaced apart and oppositely disposed metallic surfaces defining therebetween a plasma discharge space. At least one of the metallic surfaces is the surface of a metallic plate having a plurality of gas feed openings extending through the metallic surface towards said discharge space and from a distribution chamber extending along the plate opposite the discharge space. The distribution chamber has a wall opposite and distant from the plate and includes a gas inlet arrangement with a plurality of gas inlet openings distributed along the wall and connected to one or more gas feed lines to the reactor. A gas flow resistant coefficient between the one or more gas feed lines and at least a predominant portion of the connected inlet openings are at least substantially equal.

20 Claims, 2 Drawing Sheets

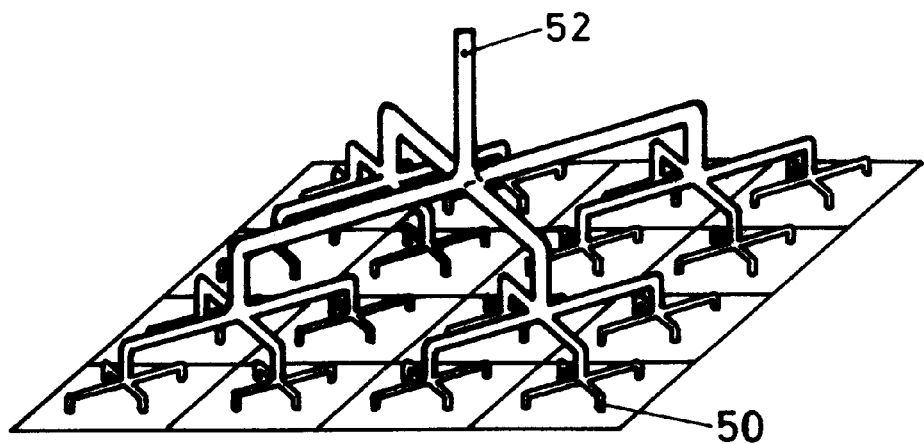
FIG.3
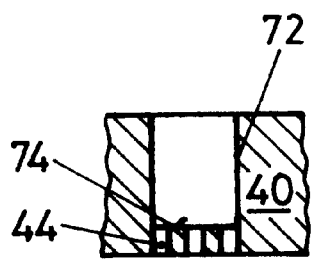 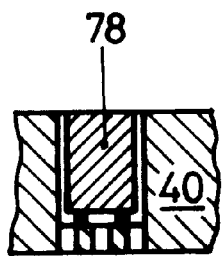 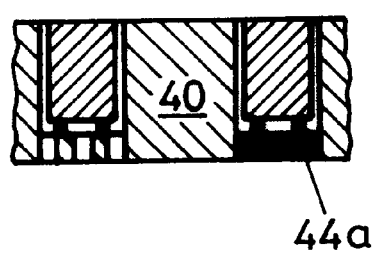
FIG.4  FIG.5  FIG.6

DESIGN OF GAS INJECTION FOR THE ELECTRODE IN A CAPACITIVELY COUPLED RF PLASMA REACTOR

The present invention is generically directed on improvements with respect to so-called shower head gas inlet technique into a plasma discharge space of a plasma reactor operated with a plasma which is electrically fed by RF, RF plus DC or pulsed RF. Thereby, it is directed to parallel plate reactors, where RF energy is coupled to the discharge space via a pair of electrodes in a capacitance plate-like arrangement, in contrary to other reactors, where the discharge energy is introduced via microwave coupling or via induction field.

Such capacitive-coupling plasma reactors are commonly used for exposing at least one substrate at a time to the processing action of a plasma glow discharge. A wide variety of such processes are known and used to modify the nature of the substrate's surfaces. Depending on the process and in particular on the nature of gas injected in the glow discharge space of the reactor, one can modify the substrates surface property, apply thin films thereto or remove, especially selectively remove, material therefrom.

The substrates can be plane or curved as e.g. car windshields. In such case the arrangement of the electrodes wherebetween the plasma discharge space is defined may be not coplanar, but accordingly curved in parallelism, so that the distance between the curved surface of the substrate and an electrode is substantially constant over the substrate's surface extent.

Although the present application claims for plasma reactors, it fully describes different inventive methods to manufacture substrates by means of process steps being performed by the claimed plasma reactor. Such manufacturing processes are especially directed on semiconductor wafers, disks for memory devices, flat display panels, window panes and web or foils.

The processes for surface treatment of substrates performed in a vacuum vessel, wherein a plasma discharge is generated with an RF component of electric field, are widely known as PVD, PECVD, as reactive ion etching, ion plating etc. processes.

Figure 1:
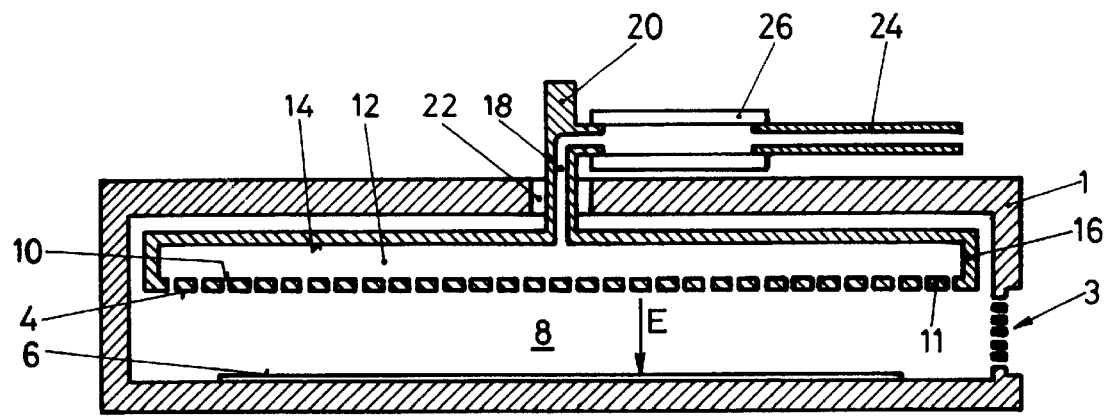

In FIG. 1 there is schematically shown a commonly used design for an RF plasma reactor with a "shower head" gas inlet. A conventional RF plasma reactor comprises a reactor vessel 1 with a pumping port 3. Oppositely disposed, spaced metallic surfaces 4 and 6 are the plasma discharge electrodes and concomitantly define the plasma discharge space 8. Between the two electrode surfaces 4 and 6 the plasma discharge supplying electric field E at least with an RF component is applied.

At least one of the plasma discharge electrode surfaces 4, 6 is provided with a multitude of gas feed openings 10, the respective electrode being the surface of a plate 11. With respect to the plasma discharge space 8 on the backside of that plate 11 there is provided a reservoir chamber 12 with a back wall 14 and lateral rim wall 16. Centrally with respect to the extent of the reservoir chamber 12 there is provided a gas inlet opening and feed line 18. Besides of the gas feed openings 10 and opening 18 the reservoir chamber 12 is sealed.

The bordering metallic walls and plate enclosing the reservoir chamber 12 are fed with plasma discharge supplying electric energy as by a central electric feed line 20. As reactor vessel 1 is customarily not operated at the same electric potential as the electrode surface 4, especially not on full RF power, but is customarily operated at a reference potential as on ground potential, the overall reservoir chamber 12 is mounted within the reactor vessel 1 in an electrically isolated manner as schematically shown by an electrically isolating support and feed-through 22. The centrally disposed gas feed line 18 is analogously connected to a usually grounded gas supply line 24 to the reactor vessel 1 via an electrically isolating connector 26.

The gas feed openings 10 in electrode surface 4 and plate 11 of reservoir chamber 12 have a small gas conductance and, accordingly, a high gas flow resistance factor, so that the internal volume of reservoir chamber 12, centrally fed with inlet gas, acts as distributing and pressure equalisation chamber to feed gas through the gas feed openings 10 at a well-controlled and desired manner most often as homogeneously distributed as possible along the electrode surface 4 and into the plasma discharge space 8. As shown in FIG. 1 gas fed to the overall reactor is submitted to a large change of electric potential (pipe 24 to feed line 18). Thereby, the conditions in the area where this high potential difference occurs, i.e. at the connector 26, is quite critical for avoiding occurrence of unwanted plasma discharge therein.

A further drawback of this known arrangement is primarily its low response time. As the internal volume of the reservoir chamber 12 must be rather large to allow even gas distribution and constant pressure along plate 11, a rather large quantity of gas is accumulated in this reservoir chamber 12 at a relatively high pressure. Thus, if during processing one wants to change the gas composition or outflow rate, such change, considered in the plasma discharge space, will occur during a rather uncontrolled transient phase with large time constants up to reaching the desired stable, newly established gas composition and/or outflow rate.

Additionally, the volume of reservoir chamber 12 must be evacuated by vacuum pumping prior to starting a treatment process in the reactor, which takes the more time the larger the respective volume is construed. This especially considering the fact that the volume 12 is only connected to the pumping port of the vessel via small, low-conductance openings 10, so that pre-processing conditioning of the overall reactor, including degassing walls, takes a long time. Nevertheless and due to the low-conductance gas feed openings 10 and the large volume of reservoir chamber 12 this technique results in a satisfying control of gas outflow distribution along the electrode surface 4, as e.g. in a homogeneous distribution. By varying the density of gas feed openings 10 along the plasma discharge space bordering electrode surface 4 the gas distribution may easily be tailored according to specific needs.

It is a generic object of the present invention to improve a shower head RF reactor as principally shown in FIG. 1, thereby maintaining its advantages. We understand under the term RF reactor a reactor wherein plasma discharge is electrically supplied with at least an RF component of electric energy.

Under a first aspect of the present invention this object is resolved by an RF plasma reactor comprising a reactor vessel and therein a pair of electrodes consisting of spaced apart and oppositely disposed metallic surfaces defining therebetween a plasma discharge space, at least one of the metallic surfaces being the surface of a metallic plate having a multitude of gas feed openings therethrough and through the metallic surface towards the discharge space and from a distribution chamber extending along the plate opposite the discharge space, whereby the distribution chamber has a back wall opposite and distant from the plate and comprises a gas inlet arrangement with a multitude of gas inlet openings, which are distributed along the back wall and which are connected to at least one gas feed line to the reactor.

Thereby and in opposition to well-known techniques according to FIG. 1, gas inlet to the inventively provided distribution chamber is not performed locally, but via a multitude of gas inlet openings. This leads to the advantage that the requirements to the distribution chamber itself with respect to large volume pressure equalisation are significantly reduced compared with the teaching according to FIG. 1: The volume of the distribution chamber may be significantly reduced, which significantly improves response time when varying gas flow and/or gas composition to the plasma discharge space.

The above mentioned object is resolved under a second aspect of the present invention by an RF plasma reactor comprising a reactor vessel and therein a pair of electrodes consisting of spaced apart and oppositely disposed metallic surfaces defining therebetween a plasma discharge space, wherein at least one of the metallic surfaces is a surface of a metallic plate having a multitude of gas feed openings therethrough towards the discharge space and from a distribution chamber extending along the plate opposite to the discharge space, wherein the distribution chamber has a back wall opposite and distant from the plate with the gas inlet arrangement and further with an electric energy feed arrangement to the two metallic surfaces being the plasma discharge electrodes, and wherein further the back wall and the plate—substantially bordering the discharge space—are electrically isolated from each other. Thereby, any electrical potential difference, as especially the large plasma-supplying potential difference, may be applied between the plate and the back wall of the distribution chamber, so that the back wall may be directly part of the vessel's wall, driven on a desired electrical potential independent from the electric potential applied to the respective electrode surface, as e.g. operated at a reference potential, commonly on ground potential.

Thereby, on one hand the critical high potential difference along the gas feed line is avoided and is much easier to be handled across the distribution chamber. Further the overall construction of the reactor is significantly simplified as by avoiding electrically isolated suspension of the overall reservoir chamber in the reactor as is provided at 22 of the known technique according to FIG. 1

The above mentioned object is further resolved under a third aspect of the present invention by an RF plasma reactor comprising a reactor vessel and therein a pair of electrodes consisting of spaced apart and oppositely disposed metallic surfaces defining therebetween a plasma discharge space, at least one of the metallic surfaces being the surface of a metallic plate having a multitude of gas feed openings therethrough and through said metallic surface towards the discharge space and from a distribution chamber extending along the plate opposite the discharge space, whereby the distribution chamber has a back wall opposite and distant from the plate and comprises a gas inlet arrangement and wherein further at least one grid member is arranged within the distribution chamber distant from and along the plate and wherein the at least one grid member is electrically isolated from the back wall and from the plate.

We understand generically under the term grid a material structure of plate-like shape with perforations therethrough. Thus a grid may be realised by a more mesh-like structure up to a rigid plate with few perforations.

By subdividing the distribution space by means of such grid members—if of electroconductive material—in two or more than two sub-spaces, any electric potential difference between the plate and the back wall is subdivided to a fraction across each of the sub-spaces. This allows, with an eye on spurious plasma discharge formation in the distribution chamber, to the possibility of increasing the height of the sub-spaces and thus of the distribution chamber, considered perpendicularly to the plate, without incurring the risk of spurious plasma ignition. This is especially true if practically the complete plasma discharge potential difference is applied across the distribution chamber. In fact the spurious capacitance between the plate and the back wall bordering the distribution chamber is reduced. Additionally, provision of the grid member as mentioned improves gas pressure distribution and homogenisation along the distribution chamber, irrespective of whether the grid member is of electroconductive material or of dielectric material.

The generic object mentioned above is further resolved, under a fourth aspect of the present invention, by an RF plasma reactor comprising a reactor vessel and therein a pair of electrodes consisting of spaced apart and oppositely disposed metallic surfaces defining therebetween a plasma discharge space, at least one of the metallic surfaces being the surface of a metallic plate having a multitude of gas feed openings therethrough and through the metallic surface towards the discharge space and from a distribution chamber extending along the plate opposite the discharge space and wherein the distribution chamber has a back wall opposite and distant from the plate, and wherein further the wall comprises a lateral rim portion which extends towards and beyond the periphery of the plate and distant therefrom, and wherein the distribution chamber communicates by an opening arrangement with the interspace between the lateral rim portion of the wall and the periphery of the plate and said opening arrangement extends substantially parallel to the plates and substantially perpendicularly to the rim portion of the wall.

On one hand an additional amount of gas is fed to the plasma discharge space at its peripheral border area. As customarily more gas, in a reactive process more reactive gas is consumed at the periphery of the plasma discharge, this extra consumption is compensated. Thereby, the density of gas inlet openings per surface area in the plate and through the metallic electrode surface may not be increased indefinitely, as under consideration of technical efforts and manufacturing expenses, so that the peripheral gas feed as stated above is a most simple technique to increase the peripheral gas flow to the plasma discharge space.

It further must be considered that by the inventively provided rim portion of the wall, distant from the periphery of the plate, an inlet channel to the plasma discharge space is formed. If there is installed an electric potential difference between the plate and the wall, then this electric potential will also be present across said space from the periphery of the plate to the rim of the wall. Surprisingly, ignition of a spurious plasma discharge between rim and periphery of the plate is far less critical than e.g. in the gas feed openings in the plate or, generically spoken, in a "single potential" electrode environment.

In preferred embodiments the features of the four plasma reactors according to the present invention and following up their four aspects are inventively combined to further inventive plasma reactors, being the features of respective two of said reactors, three of said reactors or of all four of said reactors.

Figure 2:
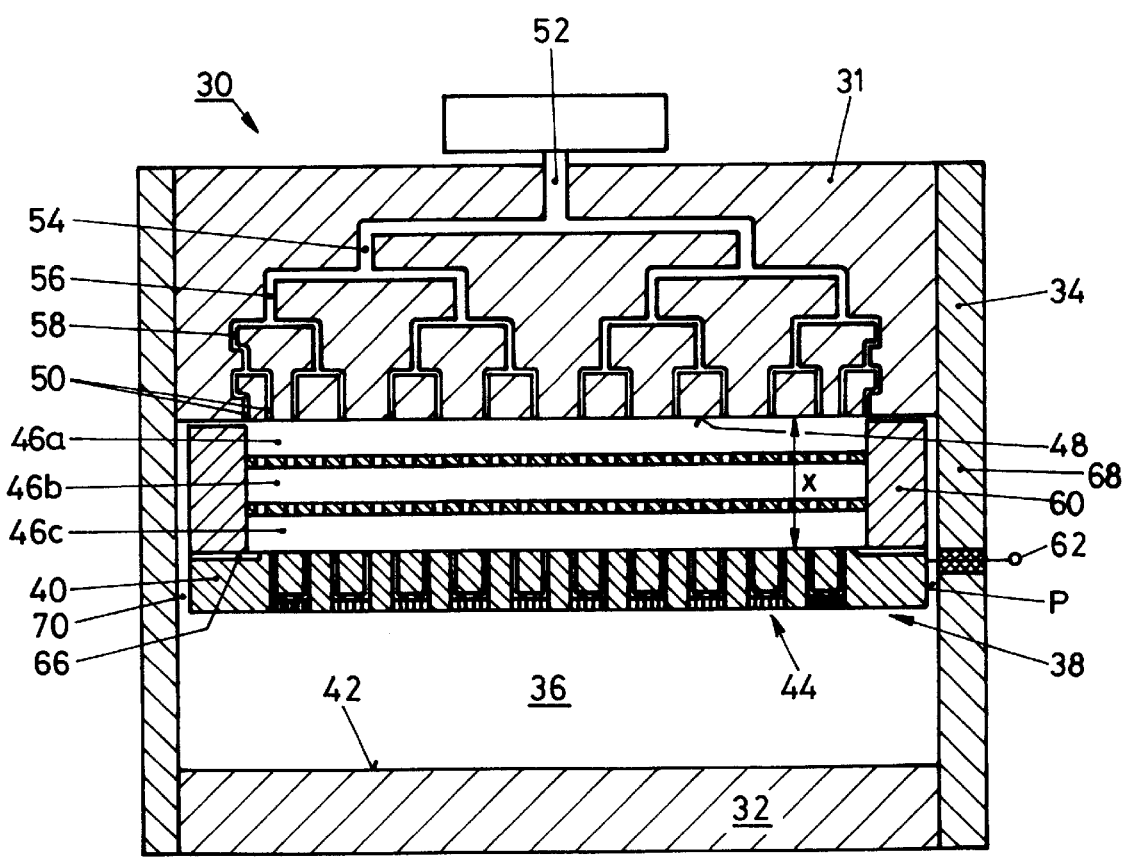

The invention under all its aspects will now be exemplified by means of figures and as far as necessary for the skilled artisan to understand the present invention even better under consideration of the description provided above. The further figures show:

FIG. 2: A schematic representation of an inventive RF plasma reactor to perform an inventive manufacturing method, thereby combining, in a preferred mode, all the inventive aspects of the present invention;

FIG. 3: in a schematic representation a preferred gas distribution arrangement for inletting gas to the distribution chamber of the inventive reactor vessel;

FIGS. 4, 5 and 6: three preferred possibilities of manufacturing gas feed openings and of controlling their flow resistance at the inventive reactor.

In FIG. 2 there is schematically shown an RP plasma reactor of a preferred mode. Therein, all the four sets of features which per se resolve the inventively set object are combined, and whereby, as was said before, each of these sets of features per se is considered inventive.

The RF reactor 30 comprises an upper wall 31, bottom wall 32 and lateral wall 34. A first electrode surface 38 is formed by the surface of a metallic plate 40 and points towards the plasma discharge space 36. In this embodiment the second plasma discharge electrode is formed especially by the metallic upper surface 42 of the bottom wall 32.

In plate 40 there is provided a multitude of openings 44 pointing towards the plasma discharge space 36 and from a distribution chamber 46. A gas inlet arrangement 48 feeds gas into distribution chamber 46, wherefrom it is dispatched to the plasma discharge space 36 through the openings 44.

1. Preferred Layout of the Gas Inlet Arrangement 48 from the Exterior of the Reactor to the Distribution Chamber 46

The gas inlet arrangement 48 comprises a multitude of inlet openings 50 distributed in a predetermined desired pattern, preferably most of them evenly along the surface of the upper wall 31 defining for the distribution chamber 46 as a back wall. In a tree-like structure the openings 50 are in flow communication with a central gas inlet line 52, whereby in each "branch" as of 54, 56, 58 of the tree of piping, the flow resistance is selected so that the flow resistance between each of the openings 50 and the gas inlet pipe 52 has a predetermined value, have in a preferred mode and at least for a substantial part of the openings 50, equal values. With respect to construing such a tree-type system of distribution lines from a single gas inlet to a multitude of gas outlets per se, we refer e.g. to the U.S. Pat. No. 5,622,606 of the same applicant as the present application.

By means of such a cascaded or tree-type feed to a multitude of gas inlet openings, changes of composition of process gas fed therethrough may be realised very rapidly. The principle of cascading the feed to the multitude of openings 50 is based on splitting the gas flow into a given number of predetermined, preferably equal sub-flows. The splitting process is repeated several times according to the branch levels 54 to 58 of FIG. 2 in order to divide the initial flow in a large number of sub-flows. The tree structure is construed according to the desired pattern of openings 50, which latter is preferably adapted to the shape of a workpiece exposed to the plasma discharge, be it rectangular, circular etc. In FIG. 3 there is shown, in a perspective view, an example of such tree structure of connecting lines between e.g. inlet line 52 and openings 50.

By the fact that gas inlet to the distribution chamber 46 is realised through a multitude of gas inlet openings 50 distributed along the surface of wall or back wall 31, which borders chamber 46, a significant improvement of gas flow control through plate 40 to the plasma discharge space 36 is achieved, which allows a significantly improved degree of freedom in selecting the volume and especially the height X of the distribution chamber 46. As shown in FIG. 2 and as in a preferred mode the cascade of feeding lines is integrated into the top wall 31 of the inventive reactor acting in this embodiment as back wall of chamber 46.

2. Electric Feed

As shown in FIG. 2 plate 40 is mounted electrically isolated from the back wall 31 of the distribution chamber 46, which back wall preferably is directly the top wall of the reactor vessel 30. This is realised e.g. by means of insulating spacers or an insulating spacer ring 60. Thus and as shown schematically at 62, electric energy is fed to metallic plate 40 and the one electrode surface 38 via a distinct power feed, which may be realised through the spacers 60 or, as shown, through the lateral wall 34 of the reactor vessel 30 etc., leaving a large degree of freedom how to feed electric energy to the plasma discharge.

In FIG. 2 the Rf feed is shown to be arranged laterally. Especially for larger plants a central feed is preferred. Thereby a central Rf feed of one or more than one feed lines are fed through upper wall 31, distribution chamber 46 to metallic plate 40.

The back wall 31 of the distribution chamber 46 may thereby be operated at any desired electrical potential, as being electrically independent from the potential applied to the electrode surface 38. Thus, it becomes possible, in a preferred embodiment, to operate the back wall 31 of the distribution chamber 46 at reference and especially on ground potential and thereby realising said back wall 31 directly by a wall of the plasma reactor's vessel. This is most advantageous when considering that this wall integrates the cascaded gas feed structure to the inlet openings 50, which overall flow-splitting system being then on ground potential, thus on equal potential as the feed pipe 52 feeding gas from the exterior to the reactor vessel 30. The limiting walls of the distribution chamber 46 are not on a unique electric potential, but on different potentials as on full plasma discharge supplying potential difference. As especially due to the distributed gas inlet openings 50 it becomes possible to significantly reduce gas pressure prevailing in the distribution chamber, the occurrence of spurious plasma ignition in the distribution chamber is avoided, even when reaching its height X.

3. Grids

As shown in FIG. 2 and as a preferred embodiment of the reactor vessel according to the present invention one, two or more grid members 64 are mounted in and along the distribution chamber 46 substantially parallel to plate 40. These grid members are mounted electrically isolated from both, back wall 31 and plate 40. They are of electroconductive or dielectric material. If construed electrically conductive, they are operated at a floating electric potential. This is realised by appropriate isolating mounts (not shown) for electroconductive grid members 64.

These grids have two advantageous effects:

On one hand and irrespective of their electrically floating or isolated mount and of their electroconductivity, they may significantly and additionally improve homogenisation of gas pressure along the distribution chamber side of plate 40 and thus homogeneity of gas feed distribution to the plasma discharge space 36.

More exactly, the presence of electrically floating grids makes it possible to increase the total distance x of chamber 46 without risking the ignition of a plasma in that space. Thereby, the overall lateral gas conductance is enlarged and hence the lateral gas diffusion.

Further, realising the electrically floating grids in the form of rather electrically floating plates with only a limited amount of holes perforated therethrough, in fact the global cascading manifold as shown in FIG. 2 within plate 31 is continued within and through chamber 46, which contributes to systematic and well-controlled spreading of the gas.

On the other hand and under electrical considerations—made of conductive material—they assume electrical potentials intermediate the potentials of plate 40 and of back wall 31. Thus, if, especially in the embodiment with mutually electrically isolated plate 40 and back wall 31, the plasma generating potential difference is applied across the distribution chamber 46, in the resulting sub-chambers 46a, 46b and 46c there result fractions of that potential difference.

As at a given pressure of gas and at a given electrical potential difference between electroconductive walls limiting such space the tendency of spurious plasma ignition becomes the larger the larger the distance between the electroconductive walls acting as spurious electrodes is made, each sub-chamber 46a, b, c operated at reduced, i.e. a fraction of overall potential difference, may be tailored with an increased height, and thus the overall discharge space 46 may be increased in height X without incurring the danger of spurious plasma ignition.

It must be considered, summarising, that with respect to spacing of electrically conductive portions at the distribution chamber, being the grid member and/or the plate or back wall, two contradictory considerations prevail. With respect to prevention of spurious plasma discharge generation the spacing X should be, at a given pressure and at a given electrical potential difference applied therebetween, as small as possible, whereas under the standpoint of pressure homogenisation along the gas feed openings 50, such spacing x should be tailored as large as possible. The inventively proposed features of distributed gas inlet to the distribution chamber as by the openings 50 electrically isolated mount of mutually directly facing electroconductive surfaces as of grids, back wall and plate lead to a high constructional flexibility of tailoring the extent of the distribution chamber, thereby especially increasing the homogenisation effect of that chamber without incurring simultaneously an increased tendency of spurious plasma generation.

4. Peripheral Gas to Plasma Discharge Space Injection

As may be seen from FIG. 2 and under this aspect two inventive measures are proposed. With respect to distribution of gas feed openings 44 from plate 40 to the plasma discharge space 36 the density of such openings 44 provided per surface area is increased when propagating along plate 40 towards its periphery P. A specifically advantageous technique how to realise such openings and how to equally vary their density per surface area shall be discussed later with the help of FIGS. 4 to 6.

Instead of or additionally to increasing the density of gas feed openings 44 per surface area as propagating towards the periphery P of plate 40 there is provided an additional opening arrangement 66 from the discharge space 46 to the plasma discharge space 36 as follows:

The back wall 31 bordering the discharge space 46 on one of its sides is provided with a rim portion 68—which clearly may be a separate part—and which may be realised, in a preferred mode, by the lateral wall 34 of the reactor vessel. This rim portion extends towards and beyond the periphery P of plate 40, distant therefrom. Thereby, a flow channel 70 is formed all around plate 40.

The opening arrangement 66 extends substantially parallel to plate 40 and substantially perpendicularly to rim portion 68 and establishes flow communication between distribution chamber 46 and, via channel 70, plasma discharge space 36. Thereby and due to the narrow spacing of channel 70 no spurious plasma discharge will be ignited therein, even if a high electric potential difference exists between plate 40 and rim portion 68.

By one and/or the other of these measures (increased density of openings 44 towards the plate periphery and/or lateral gas injection around the plate's periphery) the gas consumption distribution in the plasma discharge space 36, which is larger at its periphery, is compensated, leading to homogenised plasma discharge effect on a substrate surface disposed, according to FIG. 2 e.g. along electrode surface 42. Thereby, the advantage is gained that the plasma discharge space 36 may be exploited up to its very peripheral portion for homogeneous treatment of workpiece surfaces, which in fact leads to increased efficiency of the reactor.

5. Advantageous Realisation of Plate 40 and Opening Distribution Therethrough As shown in FIG. 4 a most advantageous realisation of the gas feed openings 44 through plate 40 is performed by machining flat bottom holes 72 in that face of plate 40, which is residing opposite the plasma discharge space 36. Such flat bottom holes 72 may be—in top view—circular, rectangular etc., continuous or not limited groove-shaped. In the bottom 74 of such holes 72 the small diameter's openings 44 to the plasma discharge space 36 are machined. Thereby, for working the small diameter openings 44 only a small fraction of the plate's 40 overall thickness is to be machined.

Thereby, it has to be considered that the plate 40 must normally be quite thick. This because of mechanical stability in that such plate must remain exactly flat and this despite the fact that it is hanging from only a few attachment points and is subjected to many changing heat cycles. Additionally, heat conductance along such plate should be so that a uniform temperature distribution is rapidly reached on changing temperatures.

Thereby and following up the concept of such recesses i.e. grooves or large-diameter bores as of 72, the flow resistance from distribution chamber 46 to plasma discharge chamber 36 may be varied and accurately tuned at the openings 44 by means of inserts 78 into such recesses as shown in FIG. 5. Due to the concept of recesses as of 72 of FIG. 4 and as is shown in FIG. 6, an increase of opening density along plate 40 up to a very high density of possibly even further reduced diameter openings 44a, especially towards the periphery P of plate 40, is of no manufacturing problem.

Additionally by means of inserts 78 the risk of plasma ignition on the backside of the openings 44, which are on one side exposed to the processing plasma discharge, is reduced.

It goes without saying that by means of inserts as shown in FIG. 5 and their respective shaping, possible asymmetric shaping, it is even possible to accurately adjust the flow resistance of selected openings 44 provided at a recess 72, e.g. to compensate for any inhomogeneous effect in plasma treatment.

Finally, it must be stated that if we have described the reactor according to the present invention with the primary target of reaching homogeneity of gas distribution all along the plasma discharge space, it is to be understood that not necessarily homogeneity is to be achieved, but more generically a well-controlled and predetermined gas distribution.

Further, the present description does clearly disclose to the skilled artisan manufacturing methods for respective work-pieces, whereby gas flow to a plasma discharge and/or electrical conditions are inventively settled, selected as was described with the hardware description of the reactor.

Beside of the invention as defined in the appending claims the following teachings per se are respectively considered inventive:

I. Plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough towards said discharge space and from a distribution chamber extending along said plate opposite said discharge space, said distribution chamber having a wall opposite and distant from said plate with a gas inlet arrangement, an electric energy feed arrangement to said two metallic surfaces, said wall and said plate being electrically isolated from each other.

II. A plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement, at least one grid member arranged within said distribution chamber distant from and along said plate and said wall, said at least one grid member being electrically isolated from said wall and from said plate.

III. A plasma reactor comprising a reactor vessel and therein a air of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement, said wall comprising a lateral rim portion extending towards and beyond said plate along the periphery of said plate and distant therefrom, said chamber communicating by an opening arrangement with the interspace between said lateral rim portion and said plate's periphery, said opening arrangement extending substantially parallel to said plate and substantially perpendicularly to said rim is portion.

IV. A plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement with a multitude of gas inlet openings distributed along said wall and connected to at least one gas feed line to said reactor, an electric energy feed arrangement to said two metallic surfaces, said wall and plate being electrically isolated from each other.

V. A plasma reactor comprising a reactor vessel and therein a pair of electrodes consisting of spaced apart and oppositely disposed metallic surfaces defining a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement with a multitude of gas inlet openings distributed along said wall and connected to at least one gas feed line to said reactor, at least one grid member being arranged within said distribution chamber along and distant from said plate and from said wall, said grid member being electrically isolated from said wall and from said plate.

VI. A plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along plate opposite said discharge space; said distribution chamber having a wall opposite and distant from said plate and comprising a gas inlet arrangement with a multitude of gas inlet openings distributed along said wall and connected to at least one gas feed line to said reactor, said wall further comprising a lateral rim portion extending towards and beyond the periphery of said plate and distant therefrom said distribution chamber communicating by an opening arrangement with the interspace between said lateral rim and the periphery of said plate, said opening arrangement extending substantially parallel to said plate and perpendicularly to said rim portion.

VII. A plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space, said distribution chamber having a wall opposite and distant from said plate with a gas inlet arrangement, an electric energy feed arrangement to said two metallic surfaces; said wall and said plate being electrically isolated from each other, at least one grid member arrangement within said distribution chamber along and distant from said plate and said wall, said grid member being electrically isolated from said wall and from said plate.

VIII. A plasma reactor comprising a reactor vessel and therein a pair of electrodes consisting of spaced apart and oppositely disposed metallic surfaces defining therebetween a plasma discharge space; at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite said plate with a gas inlet arrangement, an electric energy feed arrangement to said two metallic surfaces, said wall and said plate being electrically isolated from each other, said wall comprising a lateral rim portion extending towards and beyond the periphery of said plate and being distant therefrom, said distribution chamber communicating by an opening arrangement with the interspace between said lateral rim portion and the periphery of said plate, said opening arrangement extending substantially parallel to said plate and substantially perpendicularly to said rim portion.

IX. A plasma reactor comprising a reactor vessel and therein a pair of electrodes consisting of spaced apart and mutually oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement, at least one grid member arranged within said distribution chamber along and distant from said plate and said wall, said grid member being electrically isolated from said wall and from said plate, said wall comprising a lateral rim portion extending towards and beyond the periphery of said plate and distant therefrom, said chamber communicating by an opening arrangement with the interspace between said lateral rim portion and the periphery of said plate, said opening arrangement extending substantially parallel to said plate and perpendicularly to said rim portion.

X. A plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement with a multitude of gas inlet openings distributed along said wall and connected to at least one gas feed line to said reactor; an electric energy feed arrangement to said two metallic surfaces, said wall and said plate being electrically isolated from each other and further comprising at least one grid member arranged within said distribution chamber along and distant from said plate and said wall, said grid member being electrically isolated from said wall and from said plate.

XI. A plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement with a multitude of gas inlet openings distributed along said wall and connected to at least one gas feed line to said reactor; an electric energy feed arrangement to said two metallic surfaces, said wall and said plate being electrically isolated from each other, said wall comprising a lateral rim portion extending towards and beyond the periphery of said plate and being distant therefrom, said distribution chamber communicating by an opening arrangement with the interspace between said lateral rim portion and the periphery of said plate, said opening arrangement extending substantially parallel to said plate and substantially perpendicularly to said rim portion.

XII. A plasma reactor comprising a reactor vessel and therein a pair of electrodes consisting of spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement with a multitude of gas inlet openings distributed along said wall and connected to at least one gas feed line to said reactor; at least one grid member arranged within said distribution chamber along and distant from said plate and from said wall, said grid member being electrically isolated from said wall and from said plate, said wall further comprising a lateral rim portion extending towards and beyond the periphery of said plate and distant therefrom, said distribution chamber communicating by an opening arrangement with the interspace between said lateral rim portion and said periphery of said plate, said opening arrangement extending substantially parallel to said plate and substantially perpendicularly to said rim portion.

XIII. A plasma reactor comprising a reactor vessel and therein a pair of electrodes consisting of spaced apart and oppositely disposed metallic surfaces defining therebetween a plasma discharge space; at least one of said metallic surface being the surface of a metallic plate having a multitude of gas feed openings therethrough and through said metallic surface towards said discharge space and from a distribution chamber extending along said plate opposite said discharge space; said distribution chamber having a wall opposite and distant from said plate and having a gas inlet arrangement; an electric energy feed arrangement to said two metallic surfaces, said wall and said plate being electrically isolated from each other, further comprising at least one grid member arranged within said distribution chamber and along and distant from said plate and said wall, said grid member being electrically isolated from said wall and from said plate; said wall comprising a lateral rim portion extending towards and beyond the periphery of said plate and distant therefrom, said distribution chamber communicating by an opening arrangement with the interspace between said lateral rim portion and the periphery of said plate, said opening arrangement extending substantially parallel to said plate and substantially perpendicularly to said rim portion.

XIV. A plasma reactor comprising a reactor vessel and therein a pair of electrodes consisting of spaced apart and oppositely disposed metallic surfaces defining therebetween a plasma discharge space; at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement with a multitude of gas inlet openings distributed along said wall and connected to at least one gas feed line to said reactor; an electric energy feed arrangement to said two metallic surfaces, said wall and said plate being electrically isolated from each other; at least one grid member arranged within said distribution chamber and along and distant from said plate and said wall, said grid member being electrically isolated from said wall and from said plate; said wall comprising a lateral rim portion extending towards and beyond the periphery of said plate and distant therefrom, said chamber communicating by an opening arrangement with the interspace between said lateral rim portion and the periphery of said plate, said opening arrangement extending substantially parallel to said plate and substantially perpendicularly to said rim portion.

XV. A plasma reactor according to one of the teachings I to XIV, wherein said gas inlet arrangement comprises a multitude of gas inlet openings distributed along said wall and directed towards said plate, at least a number of said gas inlet openings being connected to a common gas feed line, the gas flow resistant coefficient between said gas feed line and at least a predominant part of said inlet openings connected thereto being at least substantially equal.

XVI. The reactor of one of the teachings I to XV, wherein at least some of said gas feed openings in said plate and arranged closer to the periphery of said plate have larger diameters than said gas feed openings located at said plate more distant from the periphery of said plate.

XVII. The reactor of one of the teachings of I to XVI, wherein at least a part of said gas feed openings through said plate co-operate with removable flow-resistance-coefficient-increasing inserts.

What is claimed is:

1. A plasma reactor, comprising a reactor vessel and a pair of electrodes arranged in the reactor vessel and having spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate opposite said discharge space; said distribution chamber having a wall opposite and distant from said plate and comprising a gas inlet arrangement to at least one gas feed line to the reactor, a gas flow resistance between said gas feed line and at least a predominant part of each of said inlet openings being at least substantially equal.

2. The reactor of claim 1, wherein the ratio of opening area of said openings through said plate per unit of area of said plate diminishes from an area closer to the center of said plate towards an area more remote from said center.

3. The reactor of claim 1, further comprising an open channel arrangement around said plate communicating with said distribution chamber and said plasma discharge space.

4. The reactor of claim 1, wherein at least a portion of said gas feed openings through said plate cooperates with removable flow-resistance coefficient-increasing inserts.

5. The reactor of claim 1, wherein at least certain of said gas feed openings arranged closer to the periphery of said plate have smaller diameters than said gas feed openings located more distant from said periphery of said plate.

6. The reactor of claim 3, wherein at least a portion of said gas feed openings through said plate cooperates with removable flow-resistance coefficient-increasing inserts.

7. The reactor of claim 3, wherein at least certain of said gas feed openings arranged closer to the periphery of said plate have smaller diameters than said gas feed openings located more distant from said periphery of said plate.

8. A plasma reactor, comprising a reactor vessel and a pair of electrodes arranged in said reactor vessel and having spaced apart and oppositely disposed metallic surfaces defining therebetween a plasma discharge space, at least one of said metallic surfaces being the surface of a metallic plate having a multitude of gas feed openings therethrough and through said metallic surface towards said discharge space and from a distribution chamber extending along said plate, said distribution chamber having opposite said discharge space, a wall distant from said plate and comprising a gas inlet arrangement with a multitude of gas inlet openings distributed along said wall and connected to at least one gas feed line to the reactor, at least a part of said gas feed openings through said plate cooperating with removable flow-resistance increasing inserts.

9. The plasma reactor of claim 8, wherein a ratio of opening area of said openings in said plate per unit of plate area diminishes from an area closer to a center of said plate to an area more remote from said center.

10. The reactor of claim 8, further comprising a gas flow channel arrangement around said plate, and communicating with said distribution chamber and said plasma discharge space.

11. The reactor of claim 8, wherein at least some of said gas feed openings arranged closer to the periphery of said plate have smaller diameters than said gas feed openings located more distant from said periphery of said plate.

12. The reactor of claim 11, wherein said at least certain of said gas feed openings cooperates with removable flow-resistance increasing inserts.

13. The reactor of claim 9, wherein at least certain of said gas feed openings arranged closer to the periphery of said plate and have smaller diameters than said gas feed openings located more distant from the periphery of said plate.

14. A plasma reactor, comprising a reactor vessel and a pair of electrodes arranged in said reactor vessel and comprising spaced apart and oppositely disposed metallic surfaces defining therebetween a plasma discharge space, at least one of said metallic surfaces being the surface of a plate having a multitude of gas feed openings therethrough and through said metallic surface towards said discharge space and from a distribution chamber extending along said plate opposite said discharge space, said distribution chamber having a wall with a metallic surface opposite and distant from said plate, said metallic surface of said wall being mutually electrically isolated from said metallic surface of said metallic plate and further comprising a gas inlet arrangement with a multitude of gas inlet openings distributed along said wall and connected to at least one gas feed line to the reactor.

15. The reactor of claim 14, wherein an electrical feed is operatively arranged relative to one of said metallic surfaces bordering said distribution chamber.

16. The reactor of claim 14, wherein a ratio of opening area of said openings through said plate per unit of area of said plate area diminishes from an area closer to a center of said plate towards an area more remote from said center.

17. The reactor of claim 14, further comprising an open channel arrangement around said plate and communicating with said distribution chamber and said plasma discharge space.

18. The reactor of claim 14, wherein at least a portion of said gas feed openings through said plate cooperates with removable flow-resistance increasing inserts.

19. The reactor of claim 14, wherein at least certain of said gas feed openings arranged closer to the periphery of the plate have smaller diameters than said gas feed openings located more distant from the periphery of said plate.

20. The reactor of claim 19, wherein said at least certain of said gas feed openings cooperate with removable flow-resistance increasing inserts.

* * * * *